United States Patent [19]
Kim et al.

[11] Patent Number: 5,991,229
[45] Date of Patent: Nov. 23, 1999

[54] INTERNAL CLOCK GENERATION CIRCUIT FOR SYNCHRONOUS SEMICONDUCTOR DEVICE

[75] Inventors: Eun-cheol Kim, Osan-shi; Hee-choul Park, Sungnam-shi, both of Rep. of Korea

[73] Assignee: Samsung Electronics, Co., Ltd., Suwon, Rep. of Korea

[21] Appl. No.: 09/004,000

[22] Filed: Jan. 8, 1998

[30] Foreign Application Priority Data

Jan. 8, 1997 [KR] Rep. of Korea .......................... 97-278

[51] Int. Cl.$^6$ .................................................. G11C 8/00
[52] U.S. Cl. .................. 365/233; 365/230.08; 365/233.5
[58] Field of Search ........................... 365/233, 230.08, 365/233.5, 240, 205

[56] References Cited

U.S. PATENT DOCUMENTS 5,521,878  5/1996  Ohtani et al. ...................... 365/230.08
5,612,926  3/1997  Yazawa et al. .......................... 365/233

*Primary Examiner*—David Nelms
*Assistant Examiner*—David Lam
*Attorney, Agent, or Firm*—Marger Johnson & McCollom, P.C.

[57] ABSTRACT

A synchronous semiconductor device being operated in synchronism with an external clock signal includes an internal clock controller and an internal clock generator. The internal clock controller is responsive to an externally applied signal indicative of a beginning of an operation and generates an internal control signal in synchronism with the external clock signal. The internal control signal is only activated for a predetermined time interval long enough to carry out the operation. The internal clock generator serves to generate an internal clock signal synchronized with the external clock signal while the internal control signal is activated. An internal buffer circuit is operated in synchronism with the internal clock signal. Accordingly, power consumption can be reduced while in a standby mode.

21 Claims, 5 Drawing Sheets

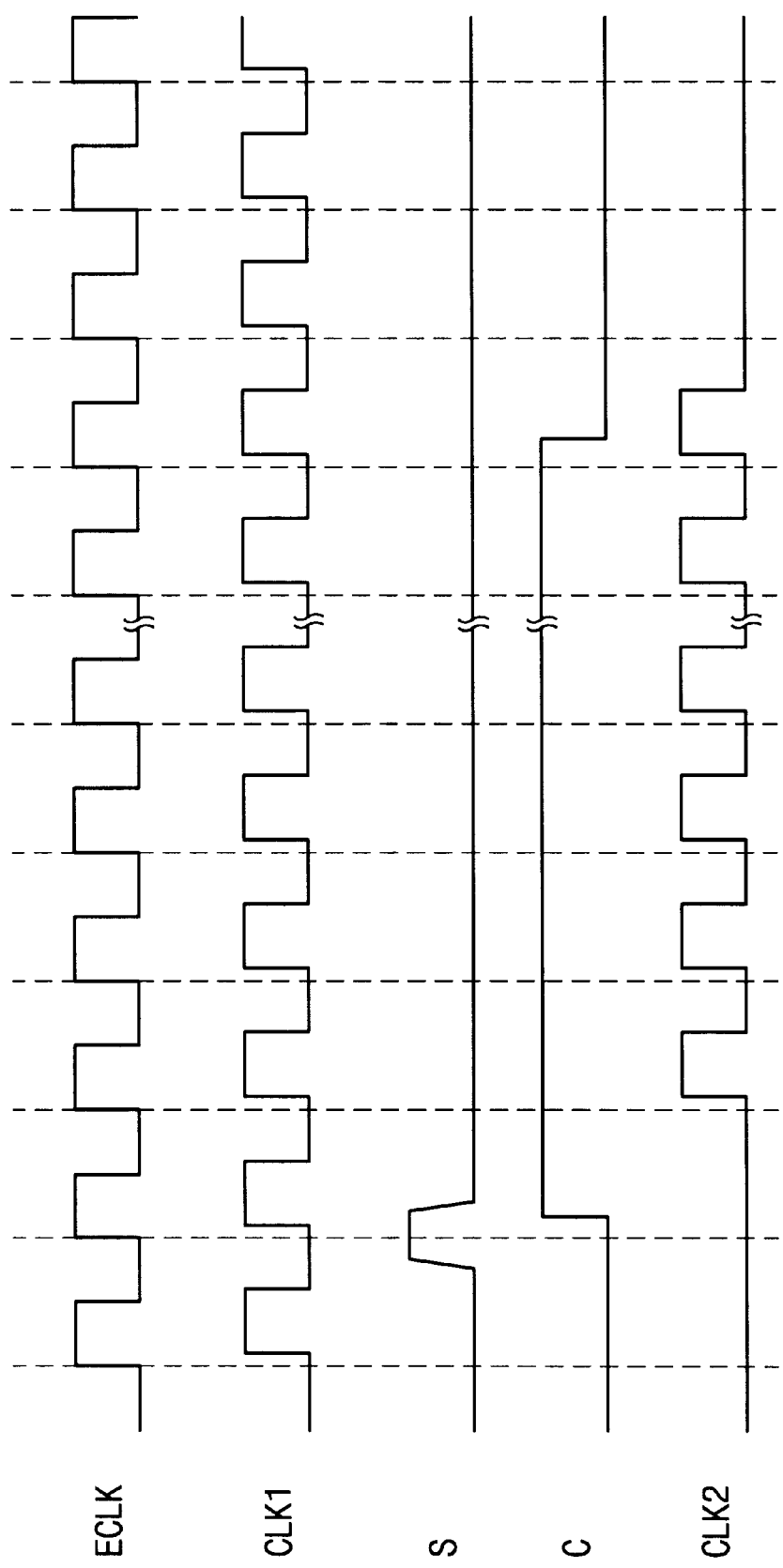

INTERNAL CLOCK GENERATION CIRCUIT FOR SYNCHRONOUS SEMICONDUCTOR DEVICE

FIELD OF THE INVENTION

The present invention relates generally to a synchronous semiconductor device and, more particularly, to an internal clock generation circuit for generating internal clock signals synchronized with an externally applied clock signal.

BACKGROUND OF THE INVENTION

Recently, low-power circuit design is attracting a great deal of attention because of the rapidly emerging battery-powered portable electronic devices, such as notebook computers, mobile telephones, personal digital assistants (PDAs), etc. Since these portable devices are primarily in a standby mode (sometimes called a "sleep mode"), wherein they are powered but not operating, it is very important to make efforts to reduce their power consumption while in the standby mode as well as while in their various operating modes. Because semiconductor devices are frequently in the standby mode, standby mode power consumption of a semiconductor device is at least important than its operating power consumption.

Even as their operating frequencies have been increasing due to the rapid development of semiconductor fabrication technologies, there have been various attempts to lower the power consumption of semiconductor devices. Generally, in a standby mode of a semiconductor device, all components except for the input buffers (such as clock buffers and data input buffers) stop operating. Therefore, in order to reduce overall device power consumption, the power consumption of the input buffers must be taken into consideration.

FIG. 1 shows a conventional internal clock generation circuit for a synchronous semiconductor device according to the prior art. Referring to FIG. 1, the internal clock generation circuit includes a clock buffer 10 which drives a considerable amount of load. An external clock signal ECLK is simply converted into internal clock signals ICLK0–ICLKn by way of the clock buffer 10. The internal clock signals ICLK0–ICLKn are delivered to a control block 20, a data input buffer 30, a data output buffer 40, an echo clock output buffer 50, and other buffers 60, respectively. These internal buffer circuits are supplied with the internal clock signals ICLK0–ICLKn only when the external clock signal ECLK is applied to the clock buffer 10.

Unfortunately, in a synchronous semiconductor device using this internal clock generation circuit, it is impossible to operate the data input buffer 30, which is used to receive commands for switching the standby mode over to the operating mode, without the external clock signal ECLK. Therefore, the data input buffer 30 is supplied with an internal clock signal ICLK1 during the standby mode. Furthermore, the external clock signal ECLK must be supplied to the clock buffer 10 even in its standby mode. Accordingly, in this prior art internal clock generation circuit, each of the internal buffer circuits, including the data input buffer 30, is clocked during the standby mode. This presents a significant limitation on the ability to reduce power consumption in the standby mode. The industry is therefore in need of a synchronous semiconductor device having an internal clock generation circuit which operates with reduced power consumption while in a standby mode.

SUMMARY OF THE INVENTION

It is therefore an object of the present invention to provide a synchronous semiconductor device having an internal clock generation circuit capable of reducing power consumption while in a standby mode.

According to an aspect of this invention, a semiconductor device, operated in synchronism with an external clock signal, includes an internal clock controller and an internal clock generator. The internal clock controller is responsive to an externally applied signal, which is indicative of a beginning of an operation, and generates an internal control signal in synchronism with the external clock signal. The internal control signal is only activated for a predetermined time interval long enough to carry out the operation. The internal clock generator serves to generate at least one internal clock signal synchronized with the external clock signal while the internal control signal is activated.

According to this invention, an internal buffer circuit can be operated in synchronism with an internal clock signal while in an operating mode. The externally applied signal may be a pulse signal. The internal clock controller may include a n-bit shift register for shifting the externally applied pulse signal in synchronism with the external clock signal.

According to the internal clock generation circuit of this invention, it is possible to cut off the internal clock signals to the internal buffer circuits, including the data input buffer, during a standby mode. The data input buffer receives external mode switching commands indicative of the changing from the standby mode to the operating mode. Thereby, the power consumption in the standby mode may be reduced.

BRIEF DESCRIPTION OF THE DRAWINGS

The present invention will be described by way of preferred embodiments described with reference to the accompanying drawings, in which like references indicate similar elements and in which:

FIG. 5 is a timing diagram illustrating the operation of the novel internal clock generation circuit shown in FIG. 2.

DETAILED DESCRIPTION OF THE PREFERRED EMBODIMENTS

In the accompanying drawings, well known circuits are shown in block diagram form so as not to obscure the objects and features of the present invention. It should be understood that the description of these embodiments is merely illustrative and should not be viewed as limiting the scope of the invention in any way.

Figure 1:
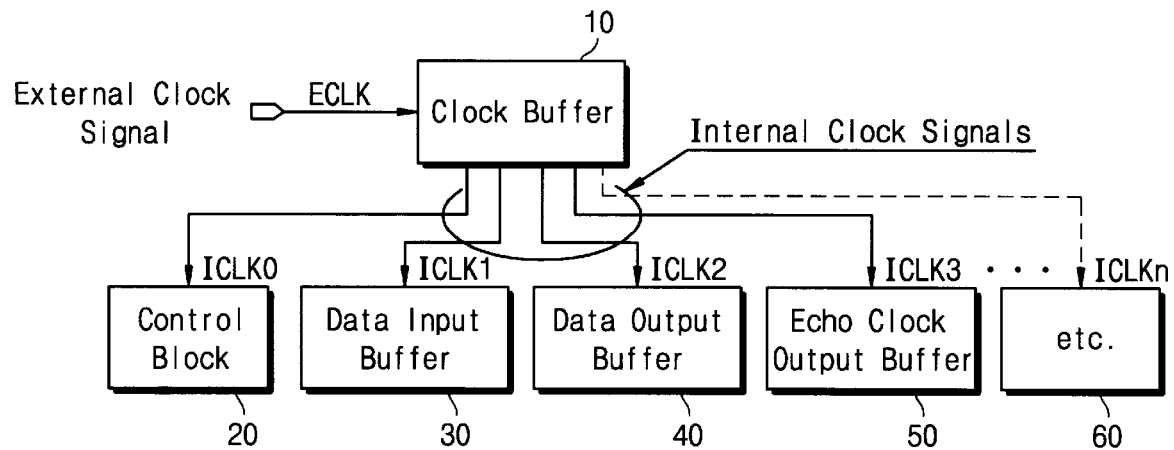
FIG. 1 is a block diagram showing a conventional internal clock generation circuit for a synchronous semiconductor device according to the prior art.
Figure 2:
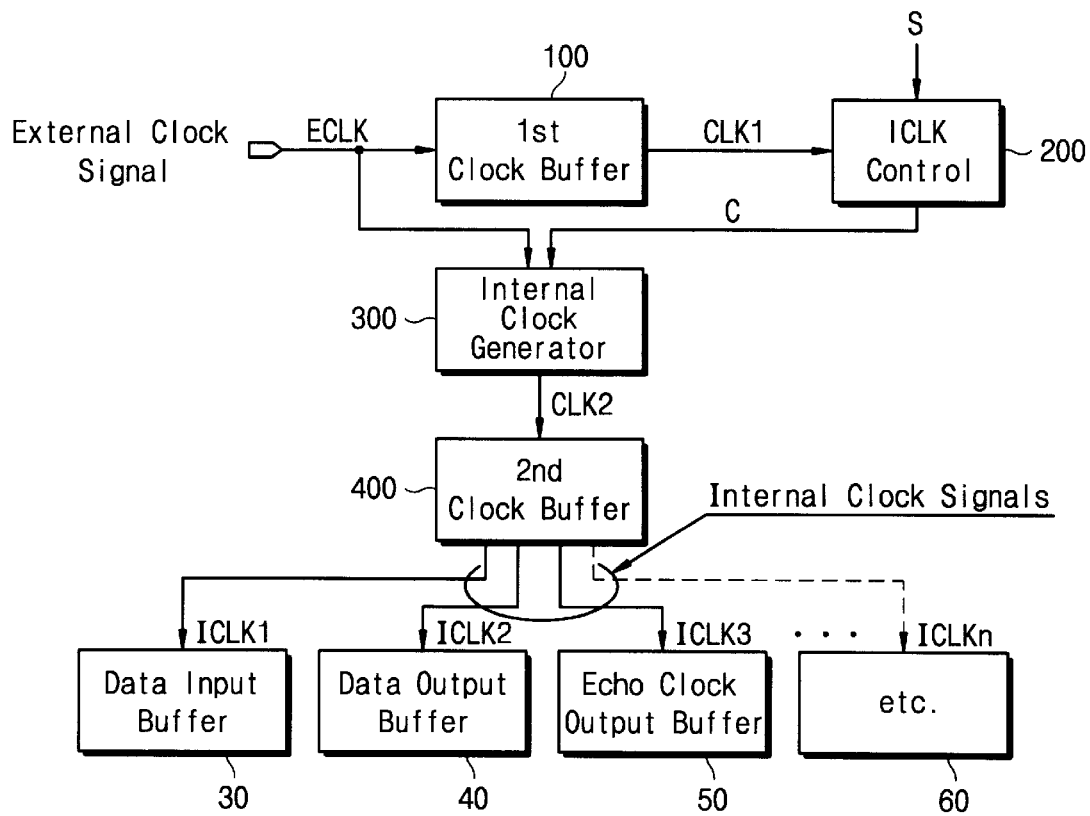
FIG. 2 is a block diagram showing a novel internal clock generation circuit according to a preferred embodiment of the present invention.

FIG. 2 shows the novel internal clock generation circuit according to a preferred embodiment of the present invention. FIG. 5 is a timing diagram illustrating the operation of the novel internal clock generation circuit shown in FIG. 2. Referring to FIGS. 2 and 5, the novel internal clock generation circuit includes an internal clock controller 200 and an internal clock generator 300. The internal clock controller 200 receives an internal clock signal CLK1, synchronized with an externally applied clock signal ECLK, via a first internal clock buffer 100. The internal clock controller 200 may also, of course, be configured to receive the external clock signal ECLK directly. The internal clock controller 200 also receives an externally applied signal S from a system controller (not shown), which indicates the beginning of an operation (e.g., a read or write operation for synchronous memory devices). The externally applied signal S may be a pulse signal. The internal clock controller 200 then generates an internal control signal C in synchronism with either the external clock signal ECLK or the internal clock signal CLK1. The internal control signal C is only activated for a predetermined time interval long enough to carry out the operation.

The internal clock generator 300 receives the external clock signal ECLK and generates an internal clock signal CLK2 in synchronism with the external clock signal ECLK under the control of the internal control signal C. The internal clock signal CLK2 is generated by the internal clock generator 300 only when the internal control signal C becomes active, and is then provided to a second internal clock buffer 400. The internal clock generator 300 is disabled when the internal control signal C is deactivated. Consequently, the internal clock controller 200 causes the internal clock generator 300 not to generate the internal clock signal CLK2 during a standby mode in which the semiconductor device is not operating. The second internal clock buffer 400 supplies the internal buffer circuits 30–60 with internal clock signals ICLK1–ICLKn, synchronized with the clock signal CLK2, only when it is fed with the clock signal CLK2 from the internal clock generator 300. As a result, a synchronous semiconductor device with the internal clock generation circuit according to this invention can have lower power consumption than conventional devices while in the standby mode.

For instance, for a synchronous semiconductor memory device having the internal clock generation circuit of this invention, the internal clock controller 200 generates the internal control signal C of a predetermined logic level in response to an externally applied read or write enable signal, which is indicative of a beginning of the read or write operation of the memory device, respectively. However, the internal control signal C is only activated for a predetermined time interval as will be described later.

Specifically, when the read or write enable signal of the synchronous semiconductor memory device becomes active, that is, when the memory device becomes operational, the internal clock controller 200 generates the internal control signal C of a high level. The internal clock generator 300 generates the clock signal CLK2, synchronized with the external clock signal ECLK, in response to the internal control signal C of the high level. Therefore, the internal buffer circuits 30–60 are supplied with internal clock signals ICLK1–ICLKn from the clock buffer 400 such that they can be operated in synchronism with the clock signals ICLK1–ICLKn. In this case, the internal control signal C is only activated for a predetermined time interval long enough to conduct the read or write operation. After completion of the operation, the internal control signal C is deactivated.

When the read or write enable signal is inactive, the internal control signal C is made logically low by the controller 200 such that the internal clock generator 300 is disabled. The internal buffer circuits 30–60 are thus also inactive because of the absence of the clock signals ICLK1–ICLKn. Power consumption is thereby reduced while in the standby mode.

Figure 3:
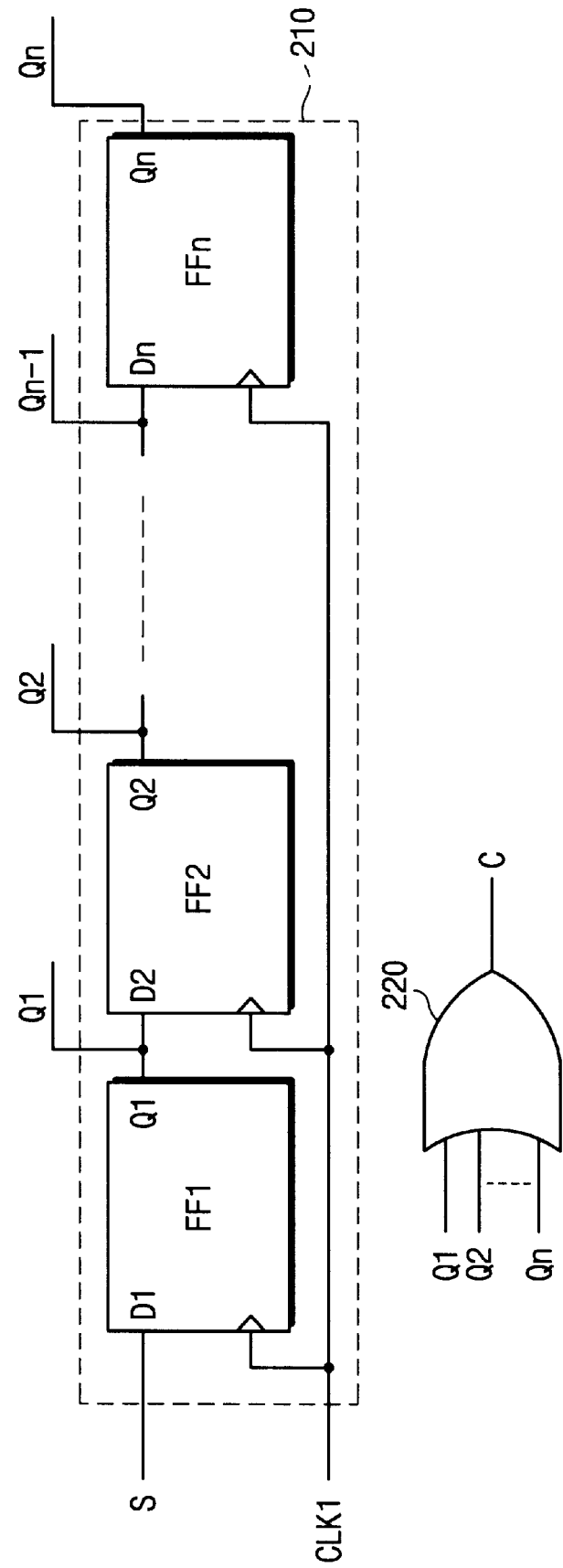
FIG. 3 is a detailed circuit diagram of the internal clock controller of the novel internal clock generation circuit shown in FIG. 2.

FIG. 3 is a detailed circuit diagram of the internal clock controller of the novel internal clock generation circuit shown in FIG. 2. Referring to FIG. 3, the internal clock controller 200 includes an n-bit shift register 210 comprising a plurality of n flip-flops FF1–FFn, and an OR logic gate 220. The n flip-flops FF1–FFn are clocked with the internal clock signal CLK1, which is synchronized with the external clock signal ECLK (see FIG. 5). The externally applied signal S is supplied as an input to a data input D1 of a first n flip-flop FF1. A data output Q1–Qn-1 of each n flip-flop, except for a last n flip-flop FFn, is fed to the data input D of the next n flip-flop (e.g., a first data output Q1 is fed to a data input D2 of a second n flip-flop FF2, etc.). The data output Q1–Qn of each n flip-flop FF1–FFn is also provided to a respective input of the OR logic gate 220. The OR logic gate 220 therefore receives the data outputs Q1–Qn from each of the n flip-flops FF1–FFn as inputs and then outputs the internal control signal C, which is active for a predetermined time interval (see FIG. 5). In this embodiment, the externally applied signal S is a pulse signal which indicates the beginning of an operation, as shown in FIG. 5. Thus, after the internal control signal C is activated, the activation state remains unchanged until the shifting of the externally applied signal S comes to an end of the shift register 210. Thus, the active period of the internal control signal C depends on the bit number of the shift register 210.

Figure 4A:
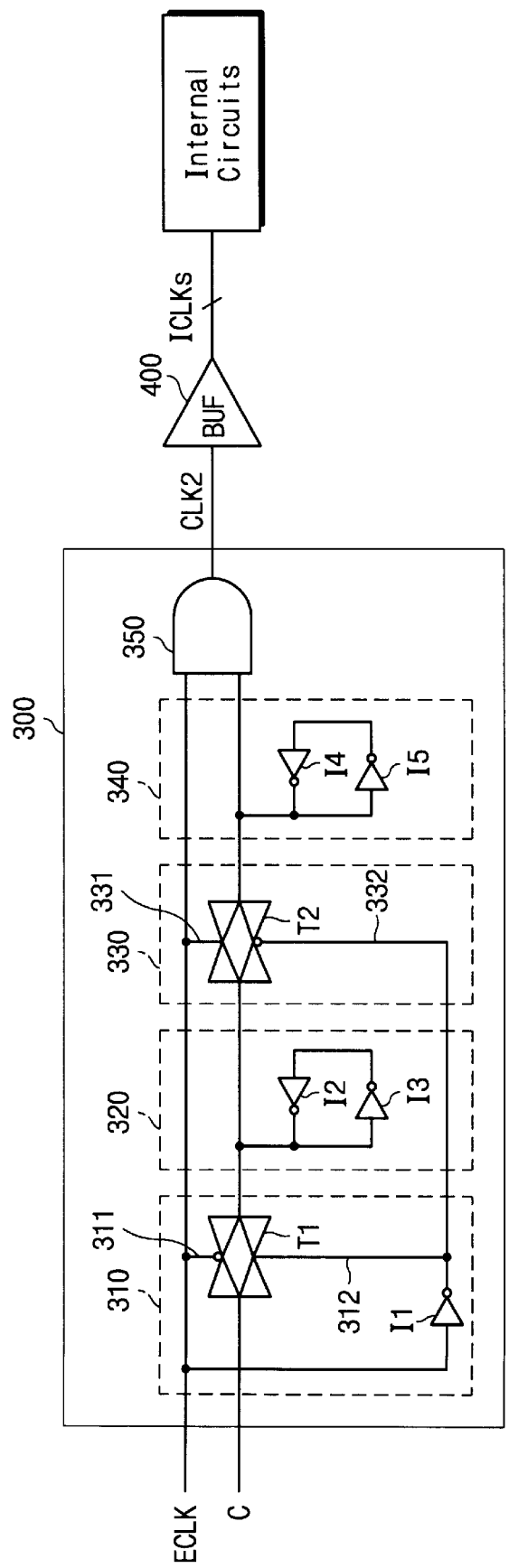
FIG. 4A is a detailed circuit diagram of a first preferred embodiment of the internal clock generator of the novel internal clock generation circuit shown in FIG. 2.

FIG. 4A is a detailed circuit diagram of a first preferred embodiment of the internal clock generator of the novel internal clock generation circuit shown in FIG. 2. Referring to FIG. 4A, the internal clock generator 300 includes a first switch circuit 310 and a second switch circuit 330, each comprising a first or second CMOS transmission gate T1 or T2, respectively, connected to a first inverter I1. The internal clock generator also includes a first signal latch circuit 320 and a second signal latch circuit 340, each comprising an inverter pair I2 and I3 or I4 and I5, respectively. An AND logic gate 350 is also included.

A first end of the first switch circuit 310 comprises an input of the first CMOS transmission gate T1 which is connected to the internal control signal C, supplied by the internal clock controller 200. A second end of the first switch circuit 310 comprises an output of the first CMOS transmission gate T1 which is connected to a first end of the second switch circuit 330. The first end of the second switch circuit 330 comprises an input of the second CMOS transmission gate T2. A second end of the second switch circuit 330 comprises an output of the second CMOS transmission gate T2 which is connected to a first input of the AND logic gate 350. The first signal latch circuit 320 is placed between the first and second CMOS transmission gates T1 and T2, respectively, while the second signal latch circuit 340 is positioned between the second CMOS transmission gate T2 and the first input of the AND logic gate 350. A second input of the AND logic gate 350 is connected directly with the external clock signal ECLK. The AND logic gate 350 also includes an output which transmits the internal clock signal CLK2 to a clock buffer 400. A gate terminal 311 of a PMOS transistor within the first CMOS transmission gate T1 is supplied with the external clock signal ECLK, while a gate terminal 312 of a NMOS transistor within the first CMOS transmission gate T1 is supplied with the external clock signal's complementary signal (i.e., the output of the inverter I1). A switch control signal (i.e., the external clock signal ECLK) and its complementary signal are also provided to gate terminals 331 and 332 of a NMOS and a PMOS transistor, respectively, within the second CMOS transmission gate T2. The first and second switch circuits 310 and 330 are thus alternately closed or opened in response to the switch control signal, which in this embodiment is the external clock signal ECLK.

Specifically, when the external clock signal ECLK is low, the first CMOS transmission gate T1 is closed so as to pass the internal control signal C to the first signal latch circuit 320, while the second CMOS transmission gate T2 is open-circuited so that the transmission of the internal control signal C, latched by the fist signal latch circuit 320, through the second CMOS transmission gate T2, is inhibited. When the external clock signal ECLK is high, the first CMOS transmission gate T1 is opened, so that the internal control signal C cannot be transferred through the first CMOS transmission gate T1 to the signal latch circuit 320. At the same time, the second CMOS transmission gate T2 is closed, so that the internal control signal C, latched by the first signal latch circuit 320, passes through the second CMOS transmission gate T2 to the AND logic gate 350. The AND logic gate 350 ANDs the data signals supplied to its inputs (i.e., the external clock ECLK and the latched internal control signal C) and thereby generates the internal clock signal CLK2 only during the active period of the internal control signal C.

When the second internal clock buffer 400 (see FIG. 2) is not used in the internal clock generation circuit of this embodiment, the internal clock generator 300 may include one or more AND logic gates. The number of AND logic gates required depends upon the number of the internal buffer circuits using the internal clocks.

Figure 4B:
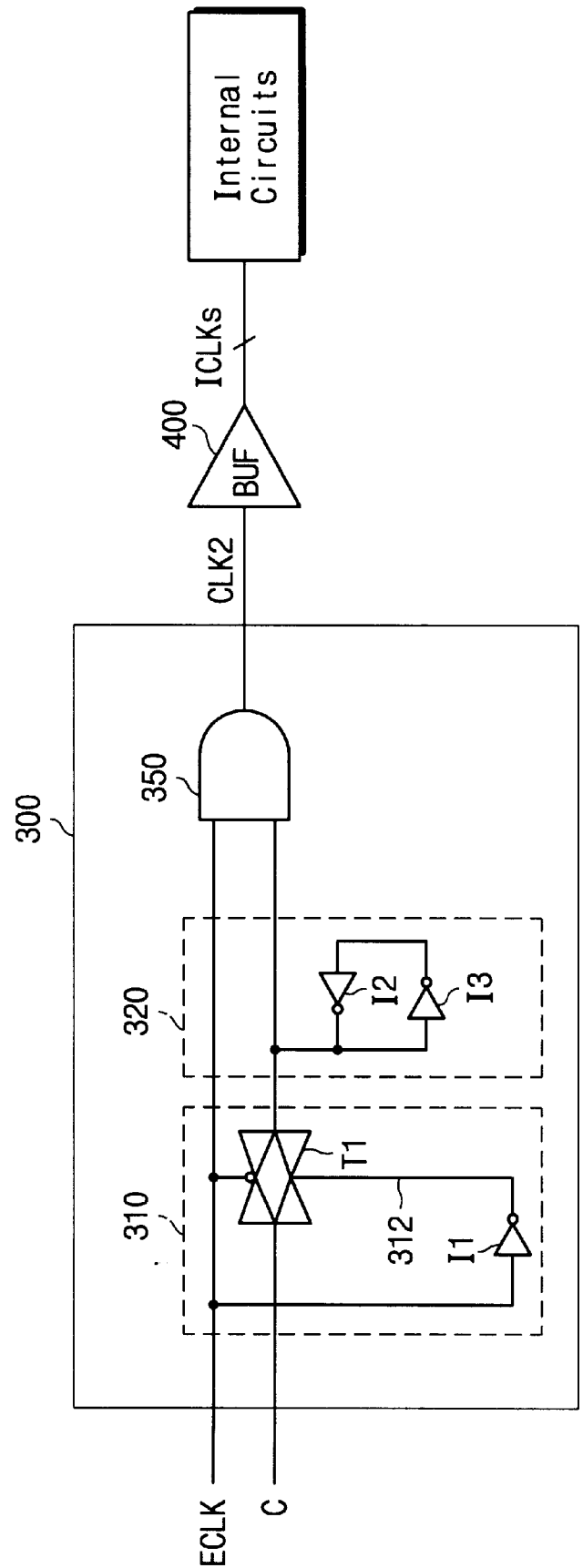
FIG. 4B is a detailed circuit diagram of a second preferred embodiment of the internal clock generator of the novel internal clock generation circuit shown in FIG. 2.

FIG. 4B is a detailed circuit diagram of a second and most preferred embodiment of the internal clock generator of the novel internal clock generation circuit shown in FIG. 2. Referring to FIG. 4B, The internal clock generator 300 (see FIG. 2) is made up of a CMOS transmission gate 310, a signal latch circuit 320, and a AND logic gate 350. The second embodiment offers improvements over the first embodiment because only one CMOS transmission gate is required. By having only one CMOS transmission gate, the time required for a clock signal is reduced. Otherwise, the operating characteristics of the internal clock generator 300 are similar to those of the first example shown in FIG. 4A. To avoid duplicative description, therefore, a detailed description of this embodiment is omitted.

As described above, according to the internal clock generation circuit of the present invention, it is possible to cut off the internal clock signals to the internal buffer circuits, including the data input buffer (which receives external mode switching commands indicative of a changing from the standby mode to the operating mode), during the standby mode. The circuit construction of the semiconductor device of this invention therefore allows for the power consumption of the device to be reduced while in the standby mode.

Although this invention has been described in terms of exemplary embodiments, it is contemplated that it may be practiced as outlined above with modifications within the spirit and scope of the appended claims.

What is claimed is:

1. A semiconductor device operated in synchronism with an external clock signal, comprising:
    means for generating an internal control signal in synchronism with the external clock signal, said means being responsive to an externally applied signal indicative of a beginning of an operation, wherein the internal control signal is only activated for a predetermined time interval long enough to carry out the operation;
    means for generating an internal clock signal synchronized with the external clock signal while the internal control signal is activated; and
    an internal buffer circuit operated in synchronism with the internal clock signal;
    wherein said means for generating the internal clock signal comprises:
        a switch circuit having a first end connected to the internal control signal and a second end; and
        an AND logic gate having a first input connected to the second end of said switch circuit, a second input connected to the external clock signal, and an output for transmitting the internal clock signal;
        wherein said switch circuit is closed or opened in response to a switch control signal.

2. The semiconductor device according to claim 1, wherein the externally applied signal is a pulse signal; and said means for generating the internal control signal comprises an n-bit shift register for shifting the externally applied pulse signal in synchronism with the external clock signal.

3. The semiconductor device according to claim 1, wherein said means for generating the internal clock signal further comprises a signal latch circuit for latching the internal control signal passed through said switch circuit.

4. The semiconductor device according to claim 1, wherein the external clock signal is used as the switch control signal.

5. A semiconductor device operated in synchronism with an external clock signal, comprising:
    means for generating an internal control signal in synchronism with the external clock signal, said means being responsive to an externally applied signal indicative of a beginning of an operation, wherein the internal control signal is only activated for a predetermined time interval long enough to carry out the operation;
    means for generating an internal clock signal synchronized with the external clock signal while the internal control signal is activated; and
    an internal buffer circuit operated in synchronism with the internal clock signal;
    wherein said means for generating the internal clock signal comprises:
        a first switch circuit responsive to a switch control signal having a first end connected to the internal control signal and a second end;
        a second switch circuit having a first end connected to the second end of said first switch circuit and a second end;
        an AND gate having a first input connected to the second end of said second switch circuit, a second input connected to the external clock signal, and an output for transmitting the internal clock signal;
        a first signal latch circuit for latching the internal control signal passed through said first switch circuit; and
        a second signal latch circuit for latching the internal control signal passed through said second switch circuit;
        wherein the first and second switch circuits are alternately closed or opened in response to the switch control signal.

6. The semiconductor device according to claim 5, wherein the external clock signal is used as the switch control signal.

7. The semiconductor device according to claim 5, wherein the first and second switch circuits each comprise a CMOS transmission gate.

8. The semiconductor device according to claim 5, wherein the first and second signal latch circuits each comprise an inverter pair.

9. A semiconductor device operated in synchronism with an external clock signal, comprising:

means for generating an internal control signal in synchronism with the external clock signal, said means for generating the internal control signal being responsive to an externally applied signal indicative of a beginning of an operation, wherein the internal control signal is only activated for a predetermined time interval long enough to carry out the operation;

means for generating an internal clock signal synchronized with the external clock signal while the internal control signal is activated, said means for generating the internal clock signal comprising a switch circuit, having a first end connected to the internal control signal and a second end; an AND logic gate having a first input connected to the second end of said switch circuit, a second input connected to the external clock signal, and an output for transmitting the internal clock signal; and a signal latch circuit for latching the internal control signal passed through said switch circuit, wherein said switch circuit is closed or opened in response to a switch control signal; and an internal buffet circuit operated in synchronism with the internal clock signal.

10. The semiconductor device according to claim 9, wherein the externally applied signal is a pulse signal, said means for generating the internal control signal comprises an n-bit shift register for shifting the externally applied pulse signal in synchronism with the external clock signal, and the external clock signal is used as the switch control signal.

11. The semiconductor device according to claim 9, wherein the switch circuit comprises a CMOS transmission gate.

12. The semiconductor device according to claim 11, wherein the signal latch circuit comprises an inverter pair.

13. A semiconductor device operated in synchronism with an external clock signal, comprising:

means for generating an internal control signal in synchronism with the external clock signal, said means for generating the internal control signal being responsive to an externally applied signal indicative of a beginning of an operation, wherein the internal control signal is only activated for a predetermined time interval long enough to carry out the operation;

means for generating an internal clock signal synchronized with the external clock signal while the internal control signal is activated, said means for generating the internal clock signal comprising a first switch circuit responsive to a switch control signal having a first end connected to the internal control signal and a second end; a second switch circuit having a first end connected to the second end of said first switch circuit and a second end; an AND gate having a first input connected to the second end of said second switch circuit, a second input connected to the external clock signal, and an output for transmitting the internal clock signal; a first signal latch circuit for latching the internal control signal passed through said first switch circuit; and a second signal latch circuit for latching the internal control signal passed through said second switch circuit; wherein the first and second switch circuits are alternately closed or opened in response to a switch control signal; and an internal buffer circuit operated in synchronism with the internal clock signal.

14. The semiconductor device according to claim 13, wherein the externally applied signal is a pulse signal, and said means for generating the internal control signal comprises an n-bit shift register for shifting the externally applied pulse signal in synchronism with the external clock signal.

15. The semiconductor device according to claim 13, wherein the first and second switch circuits each comprise a first or second CMOS transmission gate, respectively.

16. A method for operating a semiconductor device in synchronism with an external clock signal, comprising:

generating an internal control signal in synchronism with the external clock signal in response to an externally applied signal indicative of a beginning of an operation, wherein the internal control signal is only activated for a predetermined time interval long enough to carry out the operation;

generating an internal clock signal synchronized with the external clock signal while the internal control signal is activated; and operating an internal buffer circuit in synchronism with the internal clock signal wherein generating the internal clock signal comprises:

closing or opening a switch circuit in response to a switch control signal to control transmission of the internal control signal through the switch circuit, the switch circuit having a first end connected to the internal control signal and a second end;

performing an AND operation using an AND logic gate having a first input connected to the second end of the switch circuit, a second input connected to the external clock signal, and an output; and transmitting the internal clock signal from the output of the AND logic gate.

17. The method according to claim 16, wherein the externally applied signal is a pulse signal; and generating the internal control signal comprises shifting the pulse signal in synchronism with the external clock signal using an n-bit shift register.

18. The method according to claim 16, wherein generating the internal clock signal further comprises latching the internal control signal transmitted through the switch circuit.

19. The method according to claim 16, wherein the external clock signal is used as the switch control signal.

20. A method for operating a semiconductor device in synchronism with an external clock signal, comprising:

generating an internal control signal in synchronism with the external clock signal in response to an externally applied signal indicative of a beginning of an operation, wherein the internal control signal is only activated for a predetermined time interval long enough to carry out the operation;

generating an internal clock signal synchronized with the external clock signal while the internal control signal is activated; and operating an internal buffer circuit in synchronism with the internal clock signal wherein generating the internal clock signal comprises:

alternately closing or opening a first switch circuit and a second switch circuit in response to a switch control signal, the first switch circuit being responsive to the switch control signal and having a first end connected to the internal control signal and a second end, and the second switch circuit having a first end connected to the second end of the first switch circuit and a second end;

performing an AND operation using an AND gate having a first input connected to the second end of the second switch circuit, a second input connected to the external clock signal, and an output;

transmitting the internal clock signal from the output of the AND gate;

latching the internal control signal passed through the first switch circuit in a first signal latch circuit; and latching the internal control signal passed through the second switch circuit in a second signal latch circuit.

21. The method according to claim 20, wherein the external clock signal is the switch control signal.

* * * * *

UNITED STATES PATENT AND TRADEMARK OFFICE
CERTIFICATE OF CORRECTION

PATENT NO.   : 5,991,229
DATED        : November 23, 1999
INVENTOR(S)  : Kim et al.

It is certified that error appears in the above-identified patent and that said Letters Patent is hereby corrected as shown below:

Column 1,
Line 23, "important than" should read -- important as --.

Column 8,
Line 54, "claim 16" should read -- claim 17 --.

Signed and Sealed this

Fourteenth Day of May, 2002

Attest:

JAMES E. ROGAN
*Attesting Officer*      *Director of the United States Patent and Trademark Office*